United States Patent
Van Bommel et al.

(10) Patent No.: US 9,905,709 B2
(45) Date of Patent: Feb. 27, 2018

(54) PHOTOVOLTAIC CELL DEVICE WITH SWITCHABLE LIGHTING/REFLECTION

(75) Inventors: Ties Van Bommel, Eindhoven (NL); Rifat Ata Mustafa Hikmet, Eindhoven (NL); Roelof Koole, Eindhoven (NL); Dirk Kornelis Gerhardus De Boer, Eindhoven (NL)

(73) Assignee: PHILIPS LIGHTING HOLDINGS B.V., Eindhoven (NL)

( * ) Notice: Subject to any disclaimer, the term of this patent is extended or adjusted under 35 U.S.C. 154(b) by 1024 days.

(21) Appl. No.: 13/634,294

(22) PCT Filed: Mar. 10, 2011

(86) PCT No.: PCT/IB2011/050997
§ 371 (c)(1),
(2), (4) Date: Nov. 19, 2012

(87) PCT Pub. No.: WO2011/114262
PCT Pub. Date: Sep. 22, 2011

(65) Prior Publication Data
US 2013/0133736 A1 May 30, 2013

(30) Foreign Application Priority Data
Mar. 16, 2010 (EP) .................................. 10156594

(51) Int. Cl.
*H01L 31/0232* (2014.01)
*F21S 9/03* (2006.01)
(Continued)

(52) U.S. Cl.
CPC .......... *H01L 31/02322* (2013.01); *F21S 9/03* (2013.01); *G09F 13/20* (2013.01);
(Continued)

(58) Field of Classification Search
CPC ............. H01L 31/02322; H01L 31/055; H01L 31/0547; F21S 9/03; G09F 13/22;
(Continued)

(56) References Cited

U.S. PATENT DOCUMENTS 6,655,814 B1  12/2003  Tagawa
7,206,044 B2 *  4/2007  Li et al. .................. 349/113
(Continued)

FOREIGN PATENT DOCUMENTS

EP  1221511 A  7/2002
EP  1786042 A1  5/2007
(Continued)

OTHER PUBLICATIONS

Mossberg, Thomas W., Christoph M. Greiner, and Dmitri Iazikov. "Holographic Bragg Reflectors, Photonic Bandgaps and Photonic Integrated Circuits." Optics and Photonics News 15.5 (2004): 26-33.*

(Continued)

*Primary Examiner* — Keith D. Hendricks
*Assistant Examiner* — Kourtney R S Carlson (57) ABSTRACT

The present invention relates to a photovoltaic cell device with combined energy conversion and lighting option and a method a controlling such a device. It comprises a responsive element, a reflector or a light source for changing light absorption and thus appearance of photovoltaic cells (e.g. solar panel). It is also possible to combine the responsive element or the reflector with light source(s) providing extra illumination. When combined with a sensor and control unit, ambient intelligent solar panels and ambient intelligent lighting systems can be obtained. A combination of a luminescent solar concentrator (LSC) and light-emitting device is also possible, where an energy storage device is charged by a photovoltaic cell upon irradiation. The energy storage (Continued)

powers one or more light sources which are coupled to the sides of the luminescent plate. The light emitted by the light sources is coupled into the plate and (partly) converted by the luminescent plate. This results in a plate that homogeneously emits light.

14 Claims, 8 Drawing Sheets (51) Int. Cl.
G09F 13/22 (2006.01)
H01L 31/055 (2014.01)
G09F 13/20 (2006.01)
H01L 31/054 (2014.01)
F21V 33/00 (2006.01)
F21Y 105/00 (2016.01)
F21V 8/00 (2006.01)
F21Y 115/30 (2016.01)
F21Y 115/10 (2016.01)

(52) U.S. Cl.
CPC ............ G09F 13/22 (2013.01); H01L 31/055 (2013.01); H01L 31/0547 (2014.12); F21V 33/006 (2013.01); F21Y 2105/00 (2013.01); F21Y 2115/10 (2016.08); F21Y 2115/30 (2016.08); G02B 6/0095 (2013.01); Y02E 10/52 (2013.01)

(58) Field of Classification Search
CPC .... G09F 13/20; F21V 33/006; F21Y 2105/00; F21Y 2115/30; F21Y 2115/10; G02B 6/0095; Y02E 10/52
USPC ..... 136/242–265; 345/13, 83, 207; 359/265; 349/114; 257/79–103, 440, 451
See application file for complete search history.

(56) References Cited

U.S. PATENT DOCUMENTS

2002/0018632 A1    2/2002  Pelka
2006/0265921 A1*  11/2006  Korall et al. ................... 40/579
2009/0126792 A1*   5/2009  Gruhlke et al. ............... 136/259

FOREIGN PATENT DOCUMENTS

| JP | 1140587 U | 9/1989 |
| JP | 2006243485 A | 9/2006 |
| WO | 2002052192 A2 | 7/2002 |
| WO | 2006088369 A2 | 8/2006 |
| WO | 2008149276 A1 | 12/2008 |

OTHER PUBLICATIONS

Currie, Michael J. et al "High-Efficiency Organic Solar Concentrators for Photovoltaics" Science, Jul. 2008, vol. 321, No. 5886, pp. 226-228.

* cited by examiner

PHOTOVOLTAIC CELL DEVICE WITH SWITCHABLE LIGHTING/REFLECTION

FIELD OF THE INVENTION

The present invention generally relates to a photovoltaic cell device comprising a cell or cell assembly arranged to convert energy of sunlight or any other light source into electrical energy by the photovoltaic effect. Cell assemblies can be used to make solar panels, solar modules, photovoltaic arrays, solar concentrators, or the like.

BACKGROUND OF THE INVENTION

Renewable green energy sources such as photovoltaic or solar cells are gaining more importance. There is a growing demand for clean sources of energy. Such photovoltaic cells harvest energy light during the day and are idle at night. They can be combined with solar concentrators or they can be exposed directly to sunlight. A good place to position such solar panels is the front surface of a building facing the south or on the ground. However, at night, because there is less light available and light absorption of the solar cells is high, such a building covered with solar panels look very dark so that other illumination is required to provide orientation and improve appearance.

Figure 2:
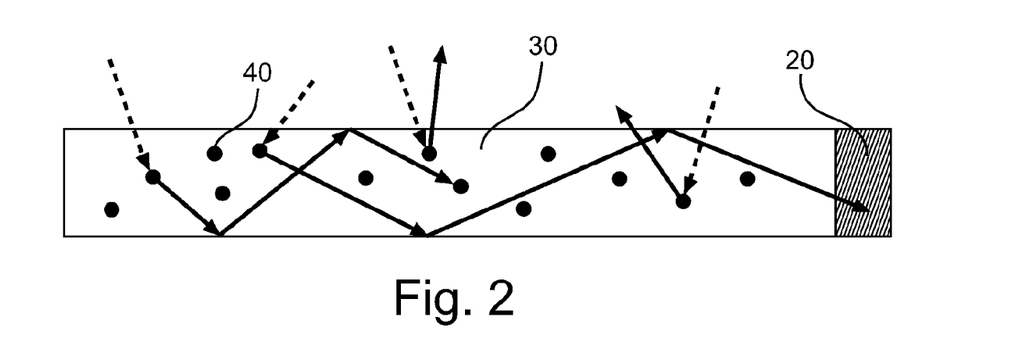
FIG. 2 shows a schematic side view of a luminescent solar concentrator which can be provided in a photovoltaic cell device.

Furthermore, the principle of a Luminescent Solar Concentrator (LSC) is described in WO2006/088369 A2, for example, and is shown schematically in FIG. 2. It is based on a transparent (polymer or glass) matrix or plate 30 containing luminophores 40, such as fluorescent dyes. (Solar) radiation is absorbed by the luminophores 40 and reemitted in all directions. Apart from fluorescent dyes, semiconductor nanocrystals such as quantum dots or quantum rods, or phosphors can be used as the luminophores 40. Due to internal reflection within the polymer or glass plate 30, most of the reemitted light is guided to the sides of the plate 30, where solar cells 20 can be attached. Thus, only a small effective area of the solar cells 20 is required for a relatively large area that collects the sun, making the device economically favourable.

So far, the LSCs are designed to be a low-cost and large-area solar cell. The intrinsic color and variation thereof make them promising building blocks for integration in e.g. buildings. However, the efficiency of the state-of-the-art LSCs in not sufficient to compete with conventional silicon solar cells, and large-scale production of LSCs as alternative energy source is far away. Another potential market for LSCs is therefore as "decorative" power supply in smaller (consumer) products.

SUMMARY OF THE INVENTION

It is an object of the present invention to provide a photovoltaic cell device with improved efficiency and/or reduced light absorption.

This object can be achieved by a device according to claim 1 and a method according to claim 19.

Accordingly, light emitting or reflecting elements are provided in the photovoltaic cell device and can be set or switched into an active state during a first operating mode so as to convert electrical energy into light energy or to reflect at least a portion of the light energy received by the photovoltaic cell device before it has reached photovoltaic cells of the photovoltaic cell device. In a second operation mode, the light emitting or reflecting elements can be set or switched into a non-active state and the photovoltaic cells can be switched into an active state, so as to convert light energy received by the photovoltaic cell device into electrical energy. This enables intermittent emission or reflection of light from the photovoltaic cell device e.g. at times where photovoltaic cells need not be active, to thereby prevent light absorption during such times. Additionally, the proposed combination of energy generating capability with lighting application can be advantageously used in solar concentrators to enhance efficiency and provide homogeneous light emission.

According to a first aspect of the above solution, the photovoltaic cell device may further comprise a solar concentrator for directing the received light energy towards the at least one photovoltaic cell, wherein the at least one light emitting or reflecting element is powered during the first operation mode by electrical energy generated from the at least one photovoltaic cell and stored in an energy storage device. The energy storage device can be charged by the photovoltaic cells upon irradiation and can be used to power the light emitting elements: The light emitted by the light emitting elements can be coupled back to the solar concentrator so as to provide homogeneous light emission.

In a specific implementation of the first aspect, the solar concentrator may comprise a transparent plate with integrated luminophores adapted to adsorb irradiation and reemit light in all directions, wherein the at least one photovoltaic cell and the at least one light emitting or reflecting element are attached to at least one of the smaller side surfaces of the transparent plate, and wherein light energy is received through at least one of the larger upper and lower surfaces of said transparent plate. In a more specific example, at least one reflective mirror may be arranged at another one of the smaller side surfaces or at another one of the larger upper and lower surfaces. In another more specific example, the at least one photovoltaic cell and the at least one light emitting or reflecting element may be attached to the same side surface of the transparent plate and arranged adjacent to each other. Hence, in the above implementations, the large upper and/or lower surfaces of the transparent plate can be used as a transparent light source which does not need any external power supply.

According to a second aspect of the above solution, the photovoltaic cell device may further comprise a switchable reflector arranged between the at least one photovoltaic cell and the at least one light emitting or reflecting element and adapted to reflect the light energy generated by the at least one light emitting or reflecting element back towards the at least one light emitting or reflecting element during the first operation mode. In a specific implementation, the at least one light emitting or reflecting element may comprises multiple light sources for generating light of different colors, the multiple light sources being arranged next to or on top of each other. In a more specific implementation, the illumination effect may be enhanced by a remote phosphor layer for generating light energy in response to an illumination by the least one light emitting or reflecting element. Thus, during daytime the reflector can be made transparent and light from the sun can be captured by the photovoltaic cell(s). At night the reflector can be turned on to reduce light absorption and reflect the light produced by the light sources.

As an example, the switchable reflector may be controlled by making use of a light sensor for detecting a level of ambient light, and a control unit for switching the at least one light emitting or reflecting element and the switchable reflector to an active state in response to an output of the light sensor. Thereby, lighting settings can be adapted and an ambient intelligent lighting system can be obtained.

According to a third aspect of the proposed solution, the at least one light emitting or reflecting element may be a responsive element covering the at least one photovoltaic cell and being switched into a transparent state during the second operation mode and into a reflective non-transparent mode during the first operation mode, and wherein the responsive element is switched in response to a change in the level of light exposure or the level of an applied voltage. As an additional option, the responsive element could have at least one additional optical state between the transparent state and the non-transparent state. Thus, the responsive element(s) are used for changing the light absorption and thus the appearance of the photovoltaic cell(s). The responsive element(s) covering the photovoltaic cell(s) (e.g. solar panel) can be switched to a transparent state during daytime and to a non-transparent and thus reflecting state during the night.

In a more specific implementation, the at least one light emitting or reflecting element may comprise an additional responsive element or element pattern provided on top of the responsive element, to thereby improve or modify reflection capability.

As an additional option, at least one light source may be arranged on top of or next to the at least one photovoltaic cell and operated during the first operation mode, wherein the responsive element is adapted to diffuse light received from the at least one light source when travelling through the responsive element. This provides the advantage that extra illumination can be achieved during the non-transparent state of the responsive element(s). As a further option, the at least one light source may comprises at least three different light sources of different colors. Thereby, colored illumination and pixels (e.g. for still or moving images or videos) can be displayed on the photovoltaic cell(s) during the first operation mode.

According to a fourth aspect of the proposed solution, at least one waveguide may additionally be provided, into which light energy generated by the at least one light emitting or reflecting element is coupled and from which light energy is coupled out at predetermined positions. In a specific example of the fourth aspect, a plurality of waveguides may be arranged in a predetermined pattern above the at least one photovoltaic cell. Thereby, shadowing, space requirements and complex wirings or electrode arrangements of light sources can be dispensed with, so as to prevent any reductions of efficiency of energy conversion by the photovoltaic cell(s).

In another specific example, the at least one waveguide may comprise integrated optical components for reflecting or diffracting the light energy coupled into the at least one waveguide when travelling through the waveguide. As an alternative or additional option, the at least one waveguide may comprises at least one of grating structures, holographic structures, photonic crystal structures and multilayer coatings for providing reflection or diffraction effects on the light energy coupled into the at least one waveguide when travelling through the waveguide. Thereby, lighting or illumination of the photovoltaic cell(s) in the first operation mode can be enhanced, structured or modified.

Further advantageous modifications are defined in the dependent claims.

These and other aspects of the invention will be apparent from and elucidated with reference to the embodiments described hereinafter.

DETAILED DESCRIPTION OF AN EMBODIMENT

Figure 1A:
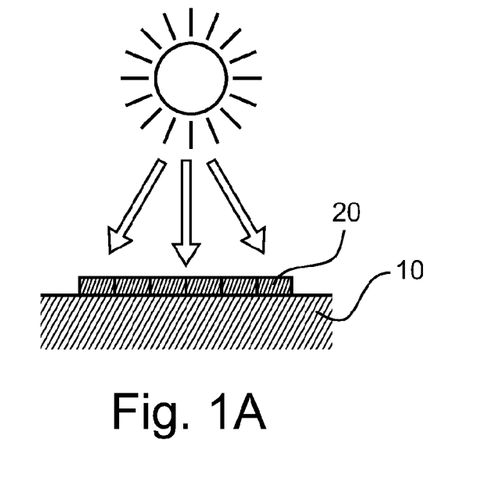
FIGS. 1A and 1B show placement options for a photovoltaic cell device.
Figure 1B:
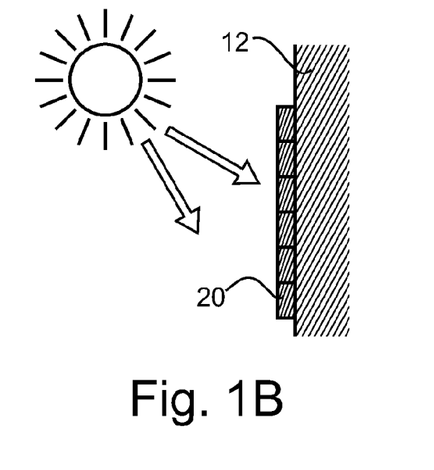

FIGS. 1A and 1B show different options for placing or positioning a photovoltaic cell device, such as for example a solar panel, a solar module, or a photovoltaic array with a plurality of photovoltaic cells 20. Such photovoltaic cells 20 harvest energy light during the day and they are idle at night. They can be positioned on the ground 10 (FIG. 1A) or on the front surface of a building 12 facing the south (FIG. 1B).

For the above or other purposes, a small effective area of photovoltaic cells for a relatively large area that collects the sun would be desirable, making the photovoltaic cell device economically favourable. This can be achieved by a solar concentrator. Due to internal reflection within a polymer or glass matrix or plate, most of the reemitted light is guided to the sides of the plate, where photoelectric cells can be attached to reduce the effective area of the cells.

FIG. 2 shows a schematic side view of a luminescent solar concentrator (LSC) which can be provided in a photovoltaic cell device.

It is based on a transparent (polymer or glass) matrix or plate 30 containing fluorescent dyes or chromophores or luminophores (dots) 40 absorbing sunlight (dashed arrows) and emitting longer-wavelength light (solid arrows) that is absorbed by a photovoltaic cell, or more specifically, a solar cell 20. Radiation is absorbed by the luminophores 40 and reemitted in all directions. Apart from fluorescent dyes, semiconductor nanocrystals such as quantum dots or quantum rods, or phosphors can be used as the luminophores 40. Due to internal reflection within the transparent plate 30, most of the reemitted light is guided to the sides of the transparent plate 30, where the solar cell 20 can be attached. A small effective area of the solar cell(s) 20 is thus required for a relatively large area that collects the sun, making the device economically favourable.

The light emitting devices (LEDs) are currently experiencing a fast development, and will replace conventional light sources in the (near) future. The low power consumption and small operating area of LEDs enable new applications, architectures, and facilitate integration in existing products.

It is suggested providing a significant improvement to applicability, efficiency and decorative aspects, by introducing a light-emitting function to the LSC. One possible application example may be a light guiding device or the like, containing outcoupling structures with LEDs or other light sources attached to one of the sides. Such devices conventionally needed a rechargeable battery for operation, which can be charged with (for example) an external solar cell. It is suggested to replaces the external power supply by integrated solar cells. The device thus consists of a combination of an LSC and light-emitting device. A conventional LSC, consisting of a luminescent matrix containing luminophores and solar cells attached to the sides, is extended with at least one light source (e.g. LED) and an energy storage device. The energy storage device (e.g. battery) is charged by the solar cell upon irradiation. The battery powers one or more LEDs which are coupled to the sides of the luminescent plate. The light emitted by the LED is coupled into the plate and (partly) converted by the luminescent matrix. This results in a plate that homogeneously emits light.

Figure 3:
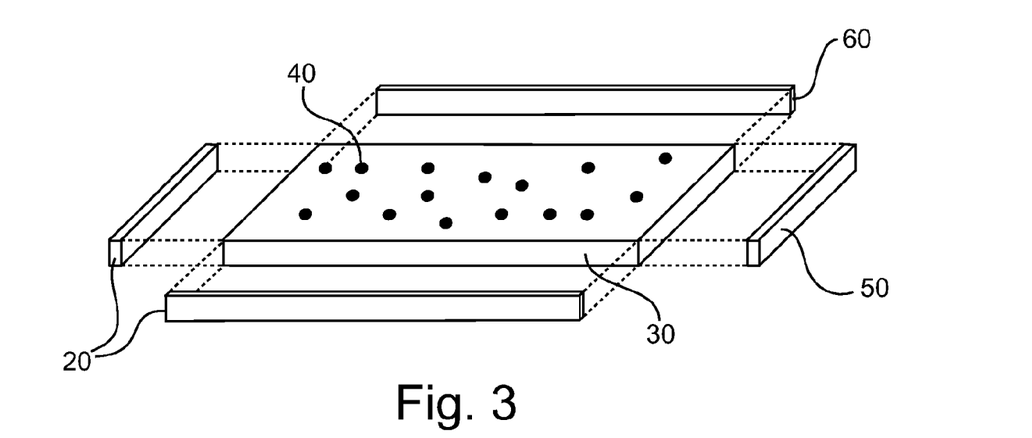
FIG. 3 shows a schematic perspective exploded view of a photovoltaic cell device with luminescent solar concentrator according to a first embodiment.

FIG. 3 shows a schematic perspective exploded view of a photovoltaic cell device with LSC according to a first embodiment.

The device comprises a transparent matrix or plate 30 which has a dimension in the vertical z-direction that is significantly smaller compared to the horizontal x and y dimension. In or on top of the transparent plate 30 luminophores 40 are integrated that absorb (solar) irradiation and reemit the light in all directions. To the smaller sides of the transparent plate 30 one or more solar cells 20 are attached. To other smaller sides of the matrix (an array of) one or more LEDs 50 are attached. To the remaining smaller side(s) reflective mirrors 60 may be attached. The energy storage device can be integrated on the back side of the solar cell 20, LED (array) 50, or mirrors 60. The energy storage device may also be a separate component, not integrated in the device.

The invention disclosed here combines the energy generating capability of LSCs with a lighting application. Besides the solar cell(s) 20, one or more small light sources, preferably LED(s) 50, are mounted to the sides of the LSC. In a first LSC operation mode, solar energy is converted into electricity and stored in an integrated battery (i.e. energy storage device). In a second LED operation mode, the light emitted by the LED(s) 50 (powered by the battery) is coupled into the transparent plate 30. The light is absorbed by the luminophores 40 in (or on top of) the transparent plate 30, and reemitted in all directions. The reemitted light will (assuming 100% quantum efficiency of the luminophore):

a) escape the slab through an escape cone;
   b) be directed to the sides of the plate 30, where it is absorbed by the solar cell 20; or
   c) be directed to the sides of the plate 30, where it is reflected by the LED(s) 50 or the attached mirror 60, and/or
   d) reabsorbed by another luminophore 40 after which it is reemitted again following steps (a)-(c).

Due to internal reflections, the light escaping from the transparent plate 30 via the escape cone will result in a slab that emits light homogeneously from the front and/or back end.

The proposed LSC-LED is a photovoltaic cell device that generates electricity from solar power in the LSC operation mode, charging a battery. In the LED operation mode, the device gives a homogeneous light from the plate, powered by the same battery.

Figure 4:
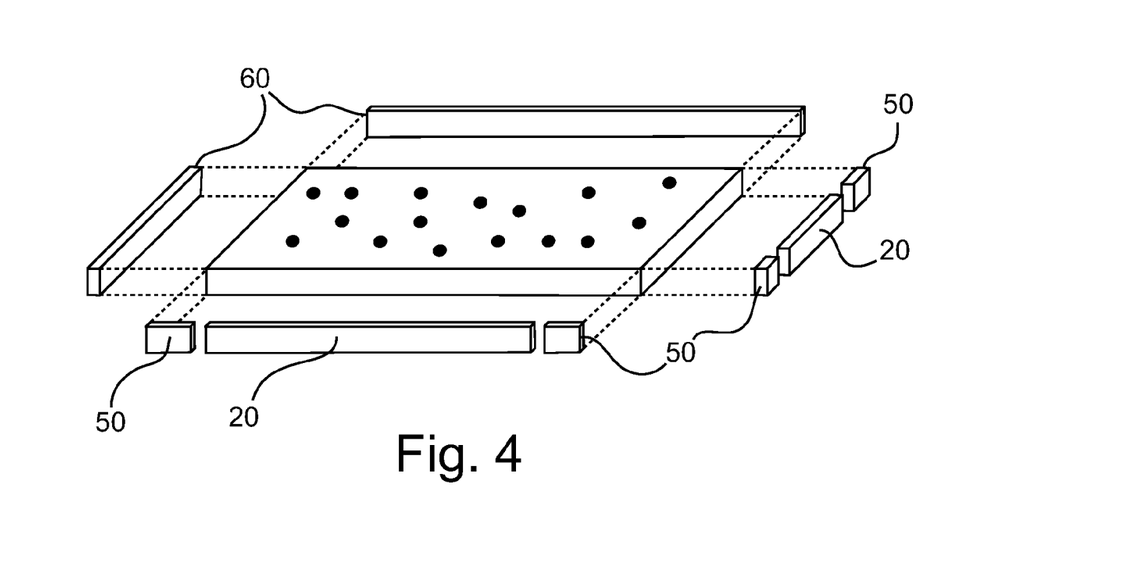
FIG. 4 shows a schematic perspective exploded view of a photovoltaic cell device with luminescent solar concentrator according to a second embodiment.

FIG. 4 shows a schematic perspective exploded view of a photovoltaic cell device with LSC according to a second embodiment.

The LEDs 50 can have a relatively small area and therefore need not to cover one entire side surface of the transparent plate 30. Therefore, in the second embodiment, the LEDs 50 are placed next to either the solar cells 20 or the mirrors 60. In FIG. 4, an exemplary case is shown where the LEDs 50 are placed next to the solar cells 20.

Depending on the geometry of the transparent plate 30, the efficiency of the solar cells 20, the efficiency and size of the LED 50, and type of application, an optimum can be found in the number of each of these components, and at which sides they are mounted. It may for example be preferred to have the solar cells 20 on the other side of the LEDs 50, or in another embodiment to have the mirrors 60 on the other side of the LEDs.

Figure 5:
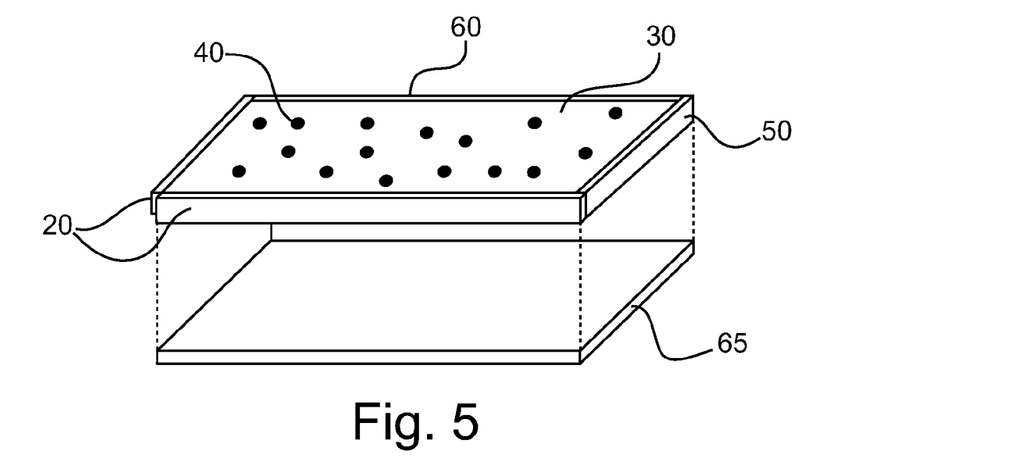
FIG. 5 shows a schematic perspective partially exploded view of a photovoltaic cell device with luminescent solar concentrator according to a third embodiment.

FIG. 5 shows a schematic perspective partially exploded view of a photovoltaic cell device with luminescent solar concentrator according to a third embodiment.

In the third embodiment, depending on the application (e.g. for a non-transparent lamp), it is preferred to also have a back-mirror 65 placed on the bottom (or upper) side of the device, as shown in FIG. 5. In this manner, the (solar) irradiation that is not absorbed by the transparent plate 10 is reflected back into the transparent plate 10 again, where it has another chance to be absorbed. In addition, during the LED operation mode, light emitted by the luminophores 40 can only escape from one side of the transparent plate 30.

In a specific implementation, the matrix of the transparent plate 30 could be transparent over a range between e.g. 400 and 900 nm, and preferably over a range of e.g. 300-1000 nm. It may consist of a polymer, or a mixture of polymers, such as methylmethacrylate (PMMA), laurylmethacrylate (LMA), 2-hydroxyethylmethacrylate (HEMA), and ethyleneglycoldimethacrylate (EGDM). When making the polymer matrix, one can start with the pure monomers, or with prepolymerized materials such as polyethylmethacrylate, or a mixture of monomers and prepolymers. The matrix could also consist of an inorganic transparent material such as glass (silicon dioxide), aluminium oxide, or titanium dioxide.

The luminophores 40 which are inserted in (or on top of) the transparent plate 30 for absorption and reemission of light can be divided in three different classes of materials:
1. fluorescent organic dyes are advantageous luminophores because of their high quantum efficiency and relatively high photo stability.
2. Semiconductor nanocrystals, or quantum dots (QDs). These inorganic nanoparticles have the advantage of a broad absorption band and narrow emission band.
3. Inorganic phosphors (rare earth ions) have the advantage of a nearly 100% efficiency and photo stability.

A mixture of the above mentioned luminophores 40 (within one class or a combination of different classes) can be advantageous because in general a broader spectrum of irradiation can be absorbed. For example, QDs can serve as broad band absorbers, and transfer their energy to the phosphor with a narrow and red-shifted emission band. A combination of QDs and dyes can be favourable in a similar way. Combining different dyes within one transparent plate 30 also broadens the absorption band, and high-energy light can be down-converted into low-energy light. In addition, the color of the plate during the LED operation mode can also be tuned (e.g. for aesthetic or signalling reasons) by inserting a mixture of different luminophores 40.

The solar cells 20 attached to the sides of the device can in principle be any of the currently available cells. The solar cell of choice depends on optimal coverage of the emission band of the luminophores 40 in use, overall efficiency, costs, and possibility to manufacture the cell with the required dimensions. Depending on the particular efficiency/cost desires of the LSC-LED device, one of the existing types of silicon solar cells (single crystal, multicrystalline, amorphous, or thin film) can be chosen. GaAs or InGaP cells are more expensive but may be advantageous in case a high overall efficiency of the LSC-LED is desired. Thin film CdTe solar cells, dye sensitized solar cells, organic solar cells, or tandem cells may also be advantageous in some specific cases.

In case of a non-rectangular shaped of the LSC-LED device, a flexible type of solar cell 20 could be used, that can adapt to the shape of the LSC.

The LED(s) 50 attached to the side of the LSC may be inorganic LED(s), emitting in the region where the luminophores 40 absorb light. Existing ultraviolet (UV), blue or green emitting LEDs such as InGaN or GaN can be used for this application. The emitted light from the LED 50 can be converted by the luminophores 40 into other wavelengths of choice.

In case a blue or UV LED 50 is used, a luminophore 40 with an absorption band in that range may be present in (or on top of) the matrix to absorb the light and convert it into lower energy light. In such a case, a luminophore 40 may be provided that absorbs the light emitted by the LED 50 distributed over the (volume or surface of) transparent plate 30 with a certain concentration gradient. By having a decreasing concentration of this luminophore 40 towards the side, the light emitted by the LED 50 can be absorbed (and re-emitted) equally distributed over the transparent plate 30. Organic LEDs (O-LEDs) may also be suitable as light source in the proposed LSC-LED device according to the first to third embodiments.

The energy storage device can be a rechargeable battery or a supercap. It can be integrated as a thin-film component attached to either the mirror 60, the solar cells 20, or the LEDs 50, resulting in a compact LSC-LED device. In other applications, the energy storage device may be a separate component, not directly integrated in the LSC-LED device. Although this increases the overall size of the LSC-LED device, it may be more cost effective.

The proposed LSC-LED device is applicable for indoor or outdoor, stand-alone lighting applications. For indoor applications, low-power consumer goods could be provided, where the LSC-LED device not only supplies energy to the application (e.g. remote control), but also acts as a light-emitting part of the application, which can be functional and/or decorative. Other indoor applications could be for example decorative furniture (e.g. vases), or as a modern construction material to be integrated in the building (e.g. as window/transparent lamp).

For outdoor applications, a stand-alone outdoor lighting (gardens, paths, etc), or a stand-alone advertising lighting (characters/symbols that shine in the evening) could be provided.

Another application could be a reading light that only works in the LED operation mode, with a rechargeable battery as power supply. The integrated solar cells 20 (and mirrors 60) in the same device can be used for charging of the battery instead of (or in addition to) an external power supply (from the net or external solar cell).

For a transparent lamp (or reading light) that is completely transparent in the visible region, a UV LED in combination with an infrared (IR) emitter could be used. For decorative purposes, the lamp may have a color. If luminophores that emit visible light are used, the lamp will glow both at daytime (even if only diffuse sunlight is present) and at night (if the LEDs are switched on). It is noted that it may be interesting to combine the proposed LSC-LED device by that of a luminescent plate containing characters and/or simple pictures with skew glowing sides, which could be applied for signs (e.g. for emergency exits). The characters or pictures can be obtained by making small grooves in the front or backside of the LSC plate under a preferred angle, which is between 15 and 75 degrees. The grooves effectively couple out the reemitted light from the luminophores or chromophores, making the characters and/or pictures clearly visible in both LSC and LED operation mode. Thus, incident light (e.g. sunlight, LED, OLED light, etc.) is converted into luminescent light which is used for signage by providing outcoupling structures and/or patterned luminescent material. Unused light can be harvested by the photovoltaic or solar cell(s).

As an alternative, the proposed photovoltaic cell device with combined energy conversion and lighting/reflection capability may comprise switchable reflector(s) with (O)LEDs. During the day the switchable reflector(s) or reflective element(s) is/are transparent and light from the sun or another light source is captured by solar cells (solar energy powering mode). At night the switchable reflector(s) or reflective element(s) is/are turned on in order to reflect all or at least a portion of the light produced by the light sources (lighting mode). For this purpose, it is suggested to use at least one of extended light sources such as transparent OLEDs, LEDs, and remote phosphor lighting configurations.

As an additional option, a sensor and a control means can be integrated, wherein the sensor is able to detect the ambient lighting level and the control means, based on the output of the sensor, sets the light source and switchable reflector in the functional on state (i.e. active state). The sensor might also be measuring the presence or actions of people in order to adapt the lighting setting and in this way ambient intelligent lighting systems are obtained. The LEDs can be arranged on top of the solar cell (concentrator) or placed separately next to the photo voltaic cells.

Figure 6:
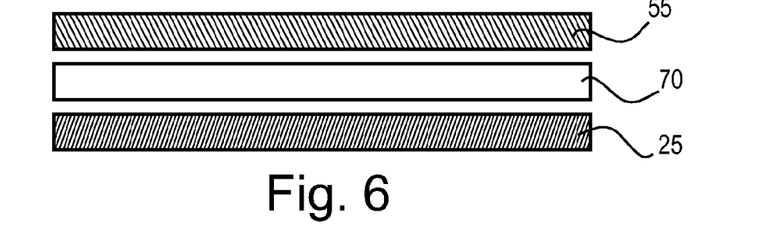
FIG. 6 shows a cross-sectional view of a photovoltaic cell device with light source and switchable reflector according to a fourth embodiment.

FIG. 6 shows a cross-sectional view of a photovoltaic cell device with light source 55 and switchable reflector 70 according to a fourth embodiment. The light source(s) 55 may be transparent OLEDs or LEDs and are placed on top of the switchable reflector 70 so as to cover a complete solar panel 25 with its solar cells. As an example, a transmissive large area lighting OLED can be placed as the light source 55 directly on top of the switchable reflector 70.

It is also possible that multiple light sources are used next to or on top of each other as described in connection with the fifth and sixth embodiments.

Figure 7:
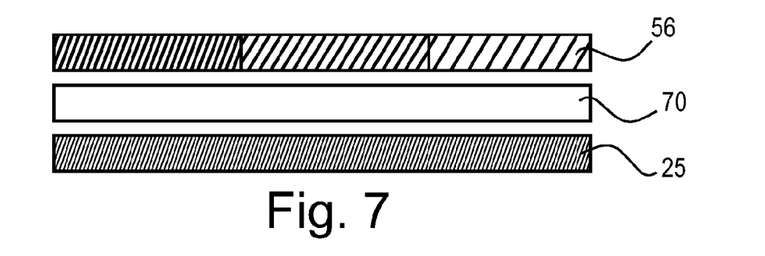
FIG. 7 shows a cross-sectional view of a photovoltaic cell device with multiple adjacent light sources and switchable reflector according to a fifth embodiment.

FIG. 7 shows a cross-sectional view of a photovoltaic cell device with multiple adjacent light sources 56 and a switchable reflector 70 according to the fifth embodiment. Multiple light sources 56 are placed next to each other on top of the switchable reflector 70 covering the complete solar panel 25. As an example, the multiple light sources 56 may be red (R), green (G), and blue (B) emitting OLEDs, or any other combination of colors. In this way all possible light colors can be obtained. In this configuration, the device may be used for signage, signaling, imaging or video purposes during the lighting mode.

Another possibility is to use side emitting white LEDs. In case RGB side-emitting LEDs are used, the device can be used for signage, signaling, imaging or video purposes as well.

Figure 8:
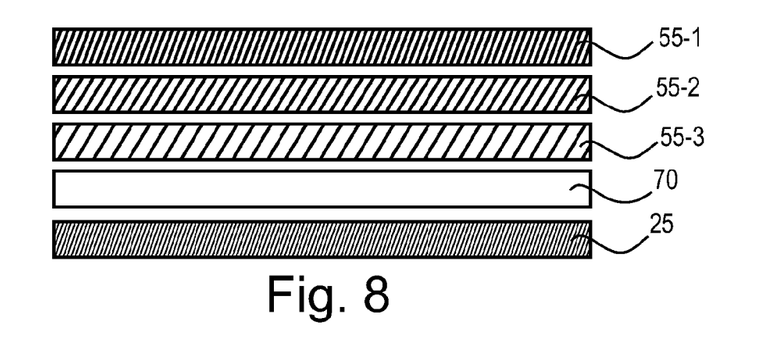
FIG. 8 shows a cross-sectional view of a photovoltaic cell device with multiple stacked light source and switchable reflector according to a sixth embodiment.

FIG. 8 shows a cross-sectional view of a photovoltaic cell device with multiple stacked light sources 55-1 to 55-3 and a switchable reflector 70 according to the sixth embodiment. The stacked multiple light sources 55-1 to 55-3 are placed on top of each other and on top of the switchable reflector 70 so as to cover the complete solar panel 25. Again, RGB OLEDs can be used or other color combinations. In addition, this configuration might also be used in order to increase the amount of light emitted by the solar panel 25.

Besides OLEDs and LEDs, also remote phosphor lighting configurations can be used.

Figure 9:
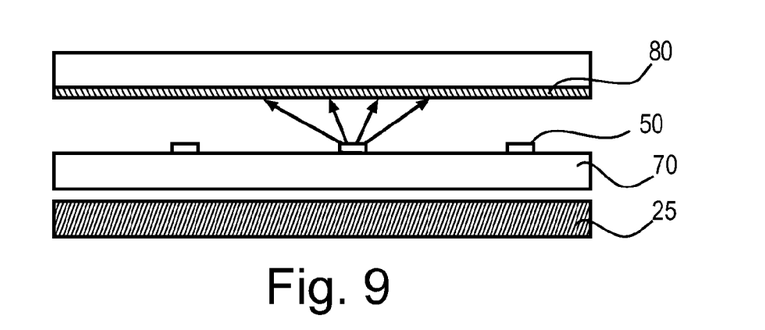
FIG. 9 shows a cross-sectional view of a photovoltaic cell device with light source, phosphor layer and switchable reflector according to a seventh embodiment.

FIG. 9 shows a cross-sectional view of a photovoltaic cell device with light source, phosphor layer and switchable reflector according to a seventh embodiment. A remote phosphor configuration or layer 80 may be arranged on a transparent carrier layer above LEDs 50 so as to be excited by light emitted from the LEDs 50.

In a modification of the above fourth to seventh embodiment, the light source 55 and switchable reflector 70 may only partially covering the solar panel 25. Thereby, the light sources 55 and switchable reflectors 70 could be shaped in the form of a text of figure, so that the device can be used for signage, text or image applications.

The solar panel 25 with switchable reflector 70 and solid state lighting (SSL) light source 55 can have any shape such as curved or angled.

The switchable reflectors 70 may include but are not limited to Polymer Dispersed Liquid Crystals (PDLC), Liquid Crystal gels (LC-gels), Cholesteric LC devices, in plain electrophoretic devices, electrowetting devices, electro-chromic devices, suspended particle devices, switchable photonic band gap devices, etc.

High transmission of the switchable reflectors 70 in the transparent mode is desirable. A preferable transmission above 80% can be achieved with devices such as PDLC, LC-gel and other devices.

Figure 10:
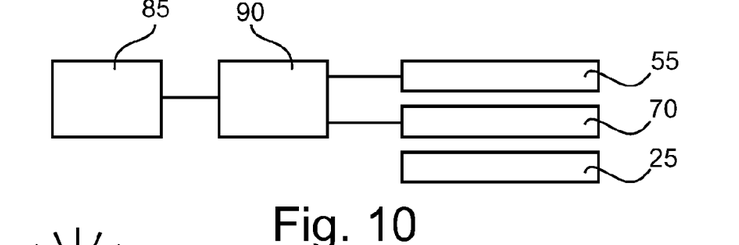
FIG. 10 shows a schematic block diagram of a control system for the photovoltaic cell device with light source and switchable reflector according to a fourth to seventh embodiment.

FIG. 10 shows a schematic block diagram of a control system for the photovoltaic cell device with light source 55 and switchable reflector 70 according to the fourth to seventh embodiment. The control system may be integrated and comprises a sensor 85 and a control unit (e.g. controller, central processing unit (CPU), etc.) 90. The sensor 85 is adapted to detect an ambient lighting level and the control unit 90 is adapted to set the light source 55 and the switchable reflector 70 in the functional on state (i.e. active state during lighting mode) based on an output of the sensor.

The sensor 85 might also be measuring the presence or actions of people in order to adapt the lighting setting and in this way ambient intelligent lighting systems can be obtained.

As a further alternative, the proposed photovoltaic cell device with combined energy conversion and lighting/reflection capability may comprise at least one responsive element for changing the appearance of the solar panel with its solar or photovoltaic cells. The responsive element(s) covering the solar panel are in a transparent state during daytime (solar energy powering mode), while non-transparent during night (reflective mode). For instance, the responsive element covering the solar panel changes from a colored to a transparent state when exposed to sun light (e.g. thermochromic, photochromic). It is also possible to adjust the appearance electrically such as by using a Polymer Dispersed Liquid Crystal (PDLC), Liquid Crystal gel (LC-gel), cholesteric liquid crystal cell, electro-chromic cell, electrowetting device, (in plain switchable) electrophoretic device, suspended particle device, switchable photonic band gap device, etc.

In addition, electrically switchable responsive elements, such as PDLC, LC-gels, electrophoretic and electrowetting, can be used. It is also possible to combine these elements with LEDs providing extra illumination in the dark. It is suggested placing the light sources on top of the solar panel behind the responsive layer. In addition, similar to FIG. 10, when combined with a sensor and control unit, ambient intelligent decorative panels and ambient intelligent lighting systems are obtained.

Figure 11A:
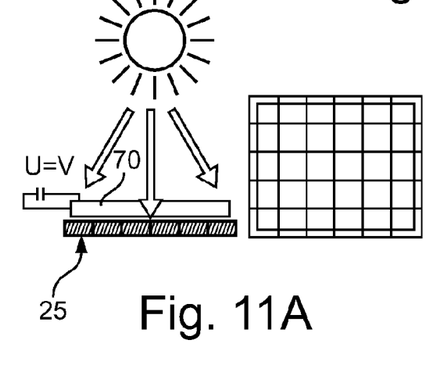
FIGS. 11A and 11B show cross-sectional and plane views of a photovoltaic cell device with responsive element according to an eighth embodiment.
Figure 11B:
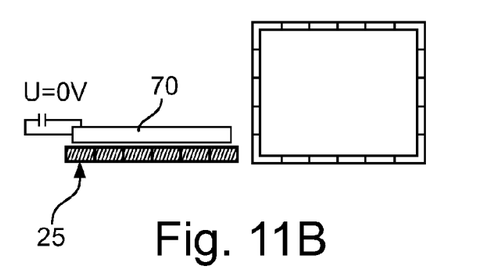

FIGS. 11A and 11B show cross-sectional (left portion) and plane views (right portion) of a photovoltaic cell device with responsive element 70 according to an eighth embodiment.

During the day, a solar panel 25 is operated in the harvesting mode with the responsive element 70 in the transparent mode (FIG. 11A). In an idle mode of the solar panel 25 (e.g. during the night) the responsive element 70 is in a non-transparent, e.g. white reflecting, state (FIG. 11B). The responsive element 70 could be non-electrically adjustable (e.g. thermochromic, photochromic) or electrically adjustable (as shown in FIGS. 11A and 11B).

Figure 12A:
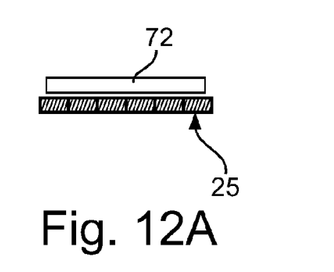
FIGS. 12A to 12C show cross-sectional views of a photovoltaic cell device with responsive element according to a ninth embodiment.
Figure 12B:
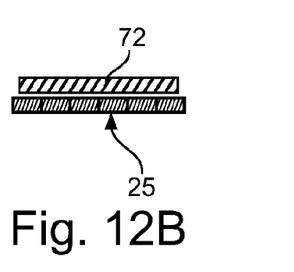
Figure 12C:
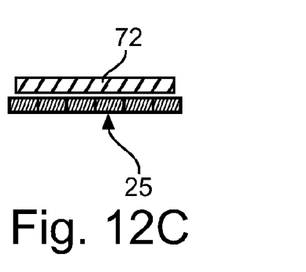

FIGS. 12A to 12C show cross-sectional views of a photovoltaic cell device with a responsive element 72 according to a ninth embodiment. Here, the responsive element 72 has more than two optical sates depending e.g. on a voltage level or the level of ambient light. Thereby, the responsive element 72 could be set into e.g. a transmittive state (FIG. 12A), a semi-transmittive state (FIG. 12B) and a non-transmittive and thus reflective state (FIG. 12C).

Figure 13A:
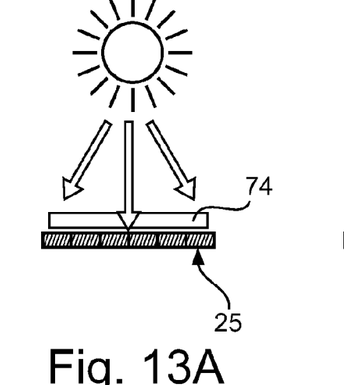
FIGS. 13A to 13C show cross-sectional views of a photovoltaic cell device with responsive element according to a tenth embodiment.
Figure 13B:
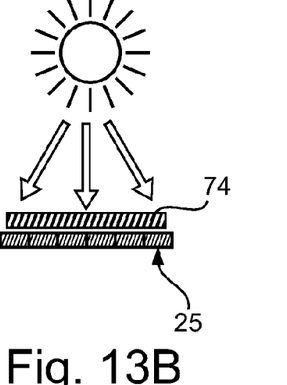
Figure 13C:
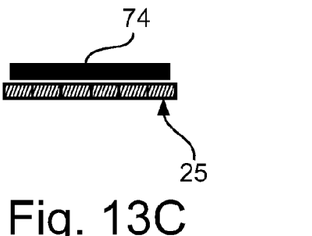

FIGS. 13A to 13C show cross-sectional views of a photovoltaic cell device with responsive element 74 according to a tenth embodiment. Here, the responsive element 74 can be configured to have a non-transparent state during (sunny) daytime also (FIG. 13B).

Figure 14A:
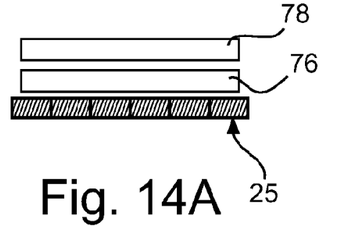
FIGS. 14A and 14B show cross-sectional views of a photovoltaic cell device with multiple responsive elements according to an eleventh embodiment.
Figure 14B:
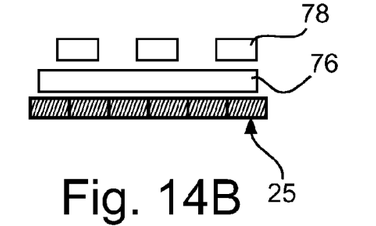

FIGS. 14A and 14B show cross-sectional views of a photovoltaic cell device with multiple responsive elements 76, 78 according to an eleventh embodiment. Here, the solar panel 25 is provided with a first responsive element 76 and a second responsive element 78 arranged on top of the first responsive element 76. The second responsive element 78 may be of the same size as the first responsive element 76 and may thus cover the same area of the solar panel 25 (FIG. 14A), or may be configured as a pattern or a plurality of sub-elements any may thus only partially cover the first responsive element 76 (FIG. 14B). In the first case, different degrees of transmittivity may be set by individually switching the two responsive elements 76, 78. In the latter case, a text or image may be generated by the second responsive element for signage or signaling purposes.

Figure 15A:
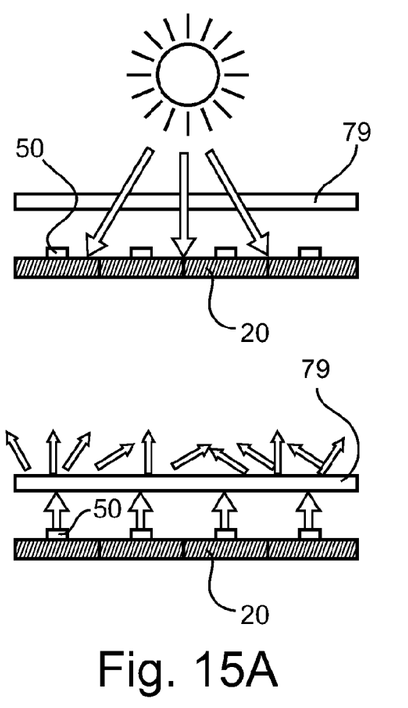
FIGS. 15A and 15B show cross-sectional views of different operation modes of a photovoltaic cell device with responsive element and light sources according to a twelfth embodiment.
Figure 15B:
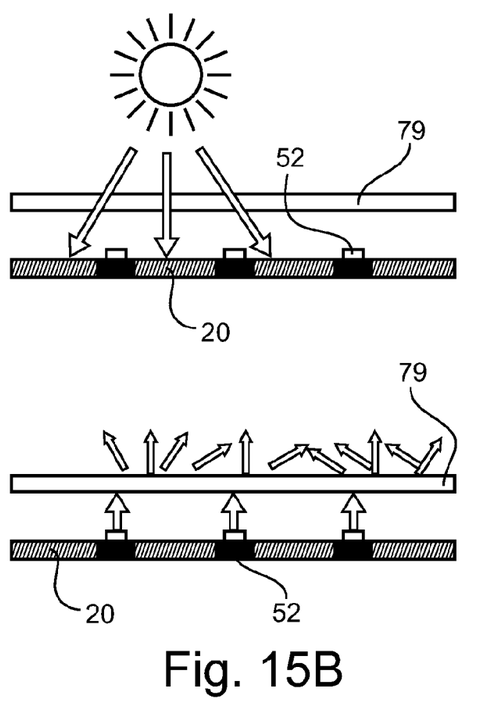

FIGS. 15A and 15B show cross-sectional views of different operation modes of a photovoltaic cell device with responsive element 79 and light sources 50, 52 according to a twelfth embodiment.

In the twelfth embodiment, responsive elements 79 are combined with LEDs providing extra illumination in the dark. It is suggested placing light sources 50 on top of the solar panel with its solar cells 20 (FIG. 15A) or placing light sources 52 separately next to the solar cells 20 (FIG. 15B) behind the responsive layer 79. When placing the light sources (e.g. LEDs) 50, 52 behind the responsive elements 79, the building where the solar panel is mounted to can have an appearance of diffuse illumination achieved if a diffractive effect is provided by the responsive element 79.

Figure 16A:
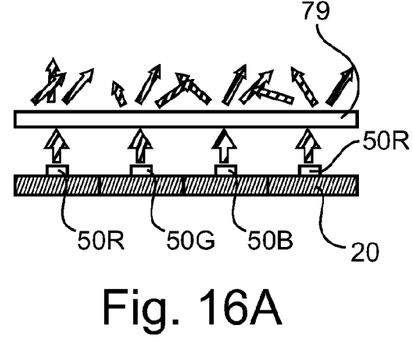
FIGS. 16A and 16B show cross-sectional views of a photovoltaic cell device with responsive element and multicolor light sources according to a thirteenth embodiment.
Figure 16B:
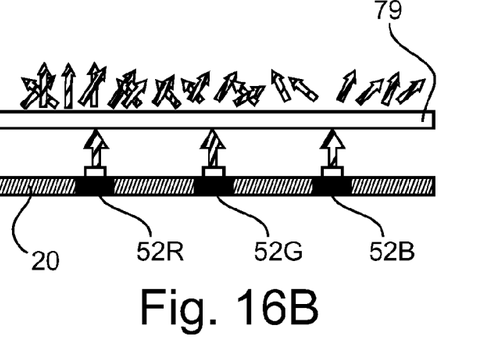

FIGS. 16A and 16B show cross-sectional views of a photovoltaic cell device with responsive element and multicolor light sources 52R, 52G, 52B according to a thirteenth embodiment. The combination with multicolor light sources (e.g. RGB LEDs) 52R, 52G, 52B can be used to produce dynamic color effects. The multicolor light sources 52R, 52B, 52G RGB can be placed on top of the solar panel (FIG. 16A) or separately next to the photo voltaic cells 20 (FIG. 16B) behind the responsive layer 79 for diffusion of multicolor (e.g. RGB) illumination.

In addition, when combined with a sensor and control unit as shown in FIG. 10, ambient intelligent decorative panels and ambient intelligent lighting systems can be obtained.

Figure 17A:
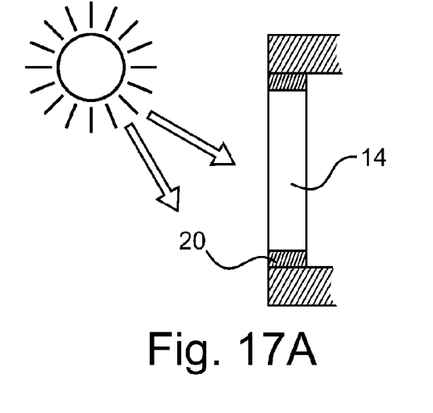
FIGS. 17A and 17B show different placing options for photovoltaic cell devices at a building.
Figure 17B:
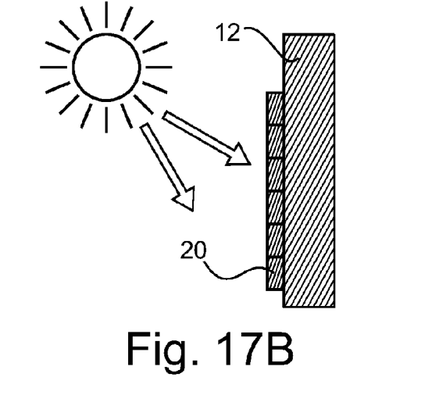

FIGS. 17A and 17B show different placing options for photovoltaic cell devices at a building.

Solar cells 20 can be combined with solar concentrators and integrated into a window 14 (FIG. 17A) or they can be exposed directly to sunlight on the front surface of a building 12 (FIG. 17B).

As explained above, the solar cells 20 can be combined with solar concentrators or they can be exposed directly to sunlight. It has been demonstrated that such solar concentrators can increase the efficiency of the system more than ten folds. Such structures can be integrated into the windows but they can also be mounted on the front surface of buildings. While such structures can be used for producing electricity during the day it has been suggested above using optical components to give solar cells an additional lighting function e.g. at night. However, the configurations described in the above first to thirteenth embodiments either shadow the light falling onto the solar cells or take up the space between them leading to reduced efficiency. In addition, these photovoltaic cell devices use complex conductive wire structures or electrode patterns for driving their light sources. Thus, efficiency of energy conversion may be reduced. Furthermore, incorporating hundreds of light sources in such devices is rather expensive.

Therefore, as another alternative, the proposed photovoltaic cell device with combined energy conversion and lighting/reflection capability may comprise a waveguide, wherein light generated by a light source (e.g. LED and/or a laser) is coupled into the waveguide in front of the solar cell and or the solar concentrator and coupled out at desired positions. Thus, the desired illumination or lighting function can be achieved without reducing efficiency.

Furthermore other optical components (such as phosphor particles, phosphor ceramics, optical functions and reflective flakes) can also be integrated into the waveguide for providing enhanced lighting effects of the solar panel(s). In addition, when combined with sensor(s) and control unit(s), ambient intelligent solar powered lighting systems can be obtained.

Figure 18A:
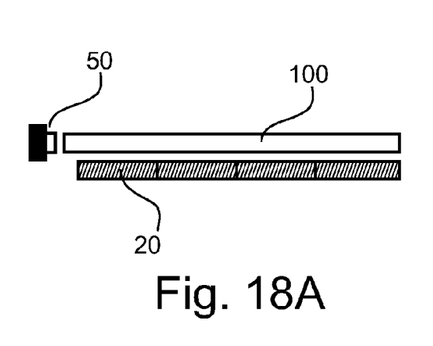
FIGS. 18A and 18B show cross-sectional views of a photovoltaic cell device with waveguide according to a fourteenth embodiment.
Figure 18B:
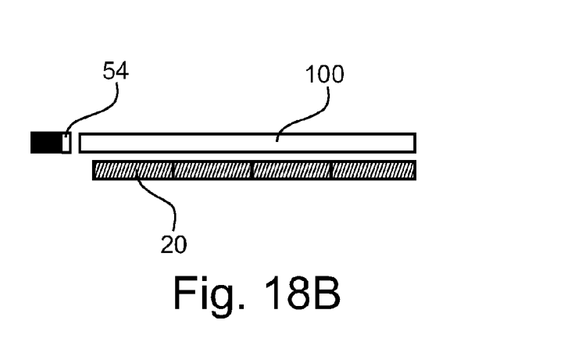

FIGS. 18A and 18B show cross-sectional views of a photovoltaic cell device with waveguide 100 according to a fourteenth embodiment. In FIG. 18A, light from an LED 50 is coupled into the waveguide 100 arranged on a solar panel with solar cells 20. In FIG. 18B, light from a laser (diode) 54 is coupled into the waveguide 100.

Figure 19A:
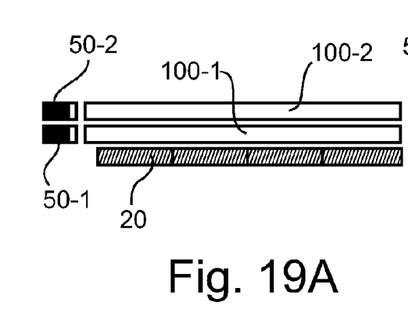
FIGS. 19A and 19B show cross-sectional views of a photovoltaic cell device with multiple waveguides according to a fifteenth embodiment.
Figure 19B:
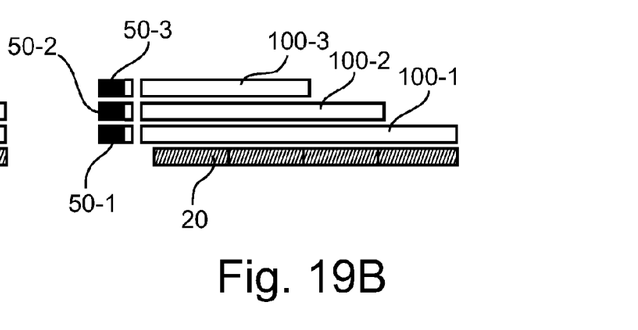

FIGS. 19A and 19B show cross-sectional views of a photovoltaic cell device with multiple waveguides 100-1 to 100-3 according to a fifteenth embodiment. Here, the two (FIG. 19A) or three (FIG. 19B) waveguides 100-1 to 100-3 which may have different lengths are provided on top of each other. Light is coupled into the waveguides through respective light sources 50-1 to 50-3 (e.g. LEDs or lasers).

Figure 20A:
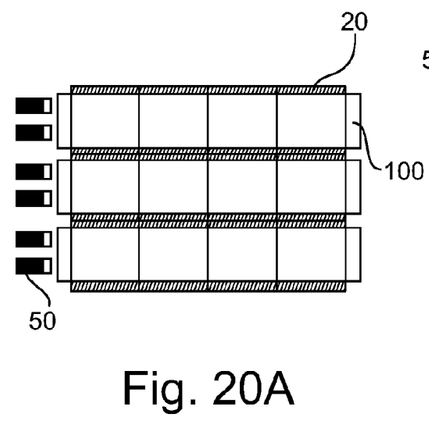
FIGS. 20A and 20B show plane views of a photovoltaic cell device with multiple waveguides according to a sixteenth embodiment.
Figure 20B:
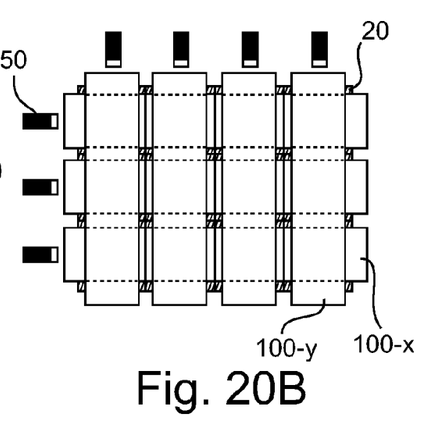

FIGS. 20A and 20B show plane views of a photovoltaic cell device with multiple waveguides 100 or 100-x and 100-y according to a sixteenth embodiment. Here, the multiple waveguides 100 or 100-x and 100-y are positioned next to each other on top of the solar cells 20. In FIG. 20B, a first layer of parallel waveguides 100-x is provided and oriented in a first direction, and a second layer of parallel waveguides 100-y is provided below or on top of the first layer, wherein the waveguides 100-y of the second layer are oriented in a second direction perpendicular to the first direction. In FIG. 20A, two different light beams are coupled into each waveguide 100 via respective light sources 50 (e.g. LEDs or lasers), while in FIG. 20B one light beam is coupled into each waveguide 100-x, 100-y via a respective single light source 50.

Figure 21A:
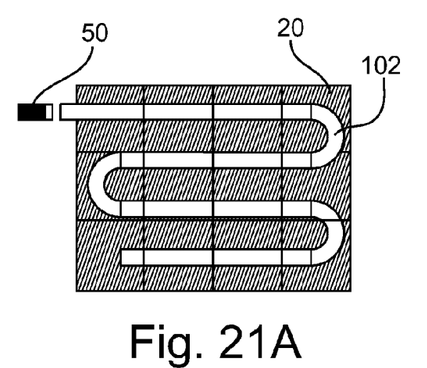
FIGS. 21A and 21B show plane views of a photovoltaic cell device with waveguide pattern(s) according to a seventeenth embodiment.
Figure 21B:
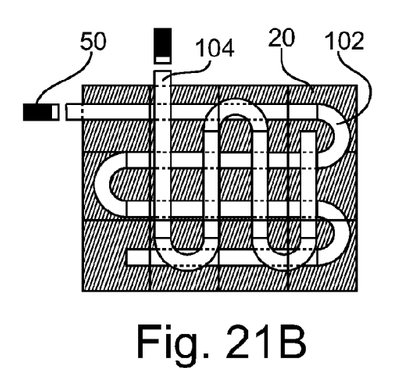

In the following seventeenth embodiment, fiber optics 102, 104 are used as waveguides with increased lighting effects.

FIGS. 21A and 21B show plane views of a photovoltaic cell device with fiber optics waveguide pattern(s) according to the seventeenth embodiment. In FIG. 21A a single fibre optics waveguide pattern 102 in a meandering shape is provided on the solar cells, while in FIG. 21B, an additional second waveguide pattern 104 is arranged on top of the first fiber optics waveguide pattern 102 with an angular displacement of 90 degrees. Light is coupled into both fiber optics waveguide patterns through respective light sources 50 (e.g. LEDs or lasers).

Optical components can also be integrated into the waveguides for enhancing the lighting effects of the solar panels, as explained in the following embodiments.

Figure 22A:
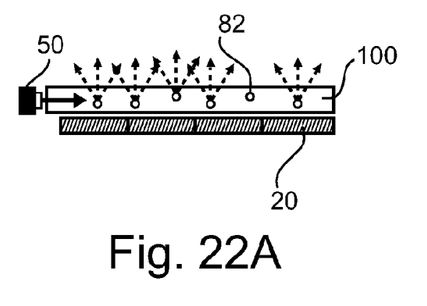
FIGS. 22A and 22B show cross-sectional views of a photovoltaic cell device with waveguide and integrated phosphor elements according to a eighteenth embodiment.
Figure 22B:
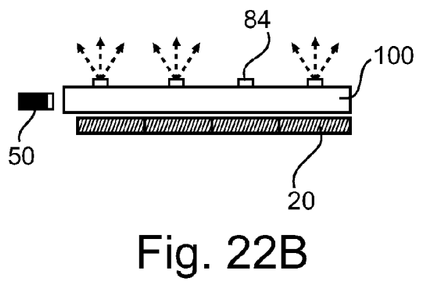

FIGS. 22A and 22B show cross-sectional views of a photovoltaic cell device with waveguide and integrated phosphor elements 82, 84 according to an eighteenth embodiment.

In the eighteenth embodiment phosphor particles (FIG. 22A) and/or phosphor ceramics (FIG. 22B) are integrated in to the waveguide 100 arranged on top of a panel of solar cells 20. A light source 50 (e.g. LED or laser) may be adapted to couple blue-violet or UV light into the waveguide 100 where it is combined with phosphor light for obtaining all other colors including white for the photovoltaic cell lighting devices. The phosphor particles 82 can for instance be dispersed in the waveguide 100. The phosphor ceramics 84 can be provided in the waveguide 100 or on top of the waveguide 100 to form desired patterns. It is also possible to produce different colors of light from different surfaces. In addition, various phosphor shapes can be used in order to create other lighting effects.

Figure 23A:
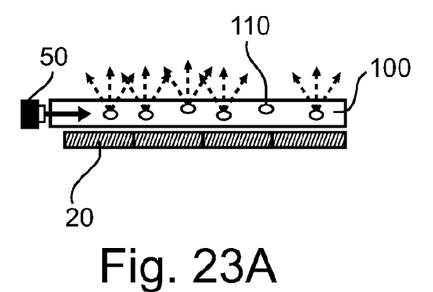
FIGS. 23A and 23B show cross-sectional views of a photovoltaic cell device with waveguide and integrated optical functions according to a nineteenth embodiment.
Figure 23B:
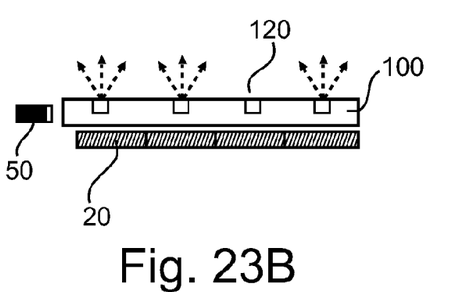

FIGS. 23A and 23B show cross-sectional views of a photovoltaic cell device with a waveguide 100 and integrated optical functions 110, 120 according to a nineteenth embodiment. In FIG. 23A, the optical function is achieved by incorporating gas bubbles into the waveguide 100, while in FIG. 23B the optical function is achieved by providing grooves in and/or on the waveguide 100.

Figure 24A:
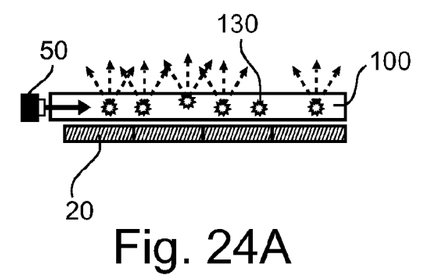
FIGS. 24A and 24B show cross-sectional views of a photovoltaic cell device with waveguide and dispersed reflecting elements according to a twentieth embodiment.
Figure 24B:
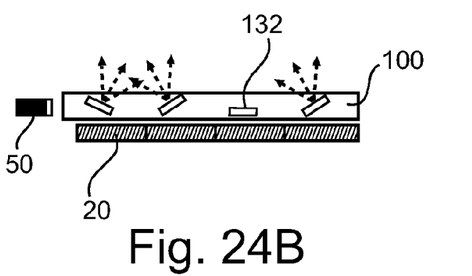

FIGS. 24A and 24B show cross-sectional views of a photovoltaic cell device with a waveguide 100 and dispersed reflecting elements 130, 132 according to a twentieth embodiment. In FIG. 24A, the reflecting elements are reflecting particles 130 of irregular shape provided in the waveguide 100, while in FIG. 24B the reflecting elements are reflecting flakes 132 or other flat-shaped elements provided in the waveguide 100.

Figure 25A:
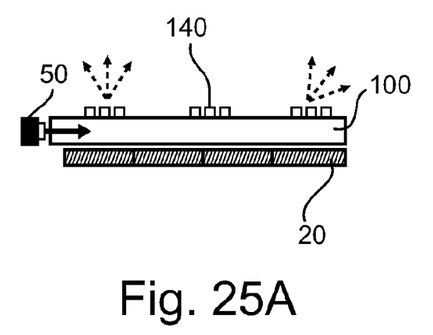
FIGS. 25A and 25B show cross-sectional views of a photovoltaic cell device with waveguide and periodic structures according to a twenty-first embodiment.
Figure 25B:
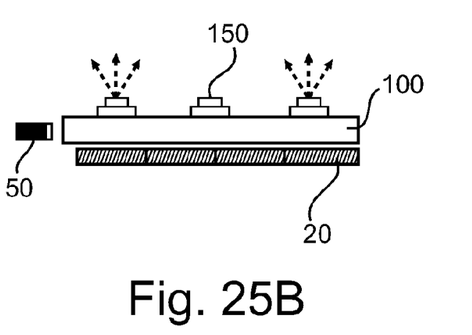

As an additional or alternative option, the waveguide 100 may be provided with various periodic structures, which show angular dependent wavelength reflection and diffraction effects. These effects can be obtained using grating structures or multi layer coatings. It is also possible to use holographic structures as well as photonic crystal structures. The suggested structures and layers can be included in the waveguide 100 to show angular dependent wavelength reflection and diffraction for producing enhanced lighting effects of the solar panels.

FIGS. 25A and 25B show cross-sectional views of a photovoltaic cell device with a waveguide 100 and periodic structures 140, 150 according to a twenty-first embodiment. In FIG. 25A, the periodic structures are photonic crystals 140 provided on the waveguide 100, while in FIG. 25B the periodic structures are multi-layer coatings 150 provided on top of the waveguide 100.

Again, the above fourteenth to twenty-first embodiments may be combined with sensor(s) and control unit(s) (and optional energy storage device for stand-alone purposes) as described in connection with FIG. 10 to provide ambient intelligent photovoltaic cell lighting systems.

In summary, a photovoltaic cell device with combined energy conversion and lighting option and a method a controlling such a device have been described. It comprises a responsive element, a reflector or a light source for changing light absorption and thus appearance of photovoltaic cells (e.g. solar panel). It is also possible to combine the responsive element or the reflector with light source(s) providing extra illumination. When combined with a sensor and control unit, ambient intelligent solar panels and ambient intelligent lighting systems can be obtained. A combination of a luminescent solar concentrator (LSC) and light-emitting device is also possible, where an energy storage device is charged by a photovoltaic cell upon irradiation. The energy storage powers one or more light sources which are coupled to the sides of the luminescent plate. The light emitted by the light sources is coupled into the plate and (partly) converted by the luminescent plate. This results in a plate that homogeneously emits light.

While the present invention has been illustrated and described in detail in the drawings and foregoing description, such illustration and description are to be considered illustrative or exemplary and not restrictive. The invention is not limited to the disclosed embodiment.

Variations to the disclosed embodiment can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope thereof.

The present invention relates to a photovoltaic cell device with combined energy conversion and lighting option and a method a controlling such a device. It comprises a responsive element, a reflector or a light source for changing light absorption and thus appearance of photovoltaic cells (e.g. solar panel). It is also possible to combine the responsive element or the reflector with light source(s) providing extra illumination. When combined with a sensor and control unit, ambient intelligent solar panels and ambient intelligent lighting systems can be obtained. A combination of a luminescent solar concentrator (LSC) and light-emitting device is also possible, where an energy storage device is charged by a photovoltaic cell upon irradiation. The energy storage powers one or more light sources which are coupled to the sides of the luminescent plate. The light emitted by the light sources is coupled into the plate and (partly) converted by the luminescent plate. This results in a plate that homogeneously emits light.

The invention claimed is:

1. A photovoltaic cell device comprising:
   at least one photovoltaic cell for converting light energy received by said photovoltaic cell device into electrical energy;
   at least one light emitting element adapted to switchably convert electrical energy into light energy;
   said photovoltaic cell device being adapted to provide a first operation mode in which said at least one light emitting element is active for converting electrical energy into light energy, and a second operation mode in which said at least one light emitting is not active while said at least one photovoltaic cell is active for converting light energy received by the photovoltaic cell device into electrical energy;

wherein the photovoltaic cell device further comprises a switchable reflector arranged between said at least one photovoltaic cell and said at least one light emitting element and adapted to reflect light energy generated by said at least one light emitting element during said first operation mode for reducing absorption by the photovoltaic cell of light emitted by the light emitting element.

2. Device according to claim 1,
further comprising a solar concentrator for directing said received light energy towards said at least one photovoltaic cell.

3. Device according to claim 2, wherein said solar concentrator comprises a transparent matrix containing fluorescent dyes or chromophores or luminophores.

4. Device according to claim 1,
wherein said at least one light emitting element comprises multiple light sources for generating light of different colors, said multiple light sources being arranged next to or on top of each other; or wherein a remote phosphor layer is provided for generating light energy in response to an illumination by said least one light emitting element.

5. Device according to claim 1, further comprising:
a light sensor for detecting a level of ambient light; and
a control unit for switching said at least one light emitting element and said switchable reflector to an active state in response to an output of said light sensor.

6. Device according to claim 1,
further comprising at least one waveguide into which light energy generated by said at least one light emitting element is coupled, and from which light energy is coupled out at predetermined positions.

7. Device according to claim 6, wherein a plurality of said waveguides are arranged in a predetermined pattern above said at least one photovoltaic cell.

8. Device according to claim 6,
wherein said at least one waveguide comprises integrated optical components for reflecting or diffracting said light energy coupled into said at least one waveguide when travelling through said waveguide; or comprises at least one of grating structures, holographic structures, photonic crystal structures and multilayer coatings for providing reflection or diffraction effects on said light energy coupled into said at least one waveguide when travelling through said waveguide.

9. Device according to claim 1, wherein said at least one light emitting element is powered during said first operation mode by electrical energy generated from said at least one photovoltaic cell and stored in an energy storage device.

10. Device according to claim 1, wherein said at least one light emitting element and switchable reflector only partially cover the at least one photovoltaic cell.

11. Device according to claim 1, wherein the switchable reflector is selected form the group consisting of: Polymer Dispersed Liquid Crystals (PDLC), Liquid Crystal gels (LC-gels), a Cholesteric LC device, an electrophoretic device, an electrowetting device, an electro-chromic device, a suspended particle device, a switchable photonic band gap device, and combinations thereof.

12. Device according to claim 11 wherein a transmission of the switchable reflector is above 80%.

13. A method of controlling a photovoltaic cell device, said method comprising:
setting light emitting elements of said photovoltaic cell device into an active state during a first operating mode so as to convert electrical energy into light energy; and
setting said light emitting elements into a non-active state and said photovoltaic cells into an active state during a second operation mode so as to convert light energy received by said photovoltaic cell device into electrical energy
wherein the photovoltaic cell device further comprises a switchable reflector arranged between said at least one photovoltaic cell and said at least one light emitting element, and wherein the method comprises adapting the switchable reflector to reflect said light energy generated by said at least one light emitting element back towards said at least one light emitting element during said first operation mode.

14. Method according to claim 13, wherein said first operation mode is used for at least one of signage, illumination, image display on consumer products or buildings.

* * * * *